United States Patent [19]
Asghar et al.

[11] Patent Number: 5,299,233
[45] Date of Patent: Mar. 29, 1994

[54] APPARATUS AND METHOD FOR ATTENUATION A RECEIVED SIGNAL IN RESPONSE TO PRESENCE OF NOISE

[75] Inventors: Safdar M. Asghar; John G. Bartkowiak, both of Austin, Tex.

[73] Assignee: Advanced Micro Devices, Inc., Austin, Tex.

[21] Appl. No.: 887,469

[22] Filed: May 22, 1992

[51] Int. Cl.$^5$ .......................... H03D 1/06; H04B 1/10
[52] U.S. Cl. ........................................ 375/99; 455/296
[58] Field of Search ...................... 375/34, 58, 99, 104; 455/222-224, 295-296; 328/162, 164

[56] References Cited

U.S. PATENT DOCUMENTS

| | | | |
|---|---|---|---|
| 3,350,650 | 10/1967 | Kemper | 455/224 |
| 4,074,201 | 2/1978 | Lennon | 455/222 |
| 4,371,981 | 2/1983 | King et al. | 455/222 |

Primary Examiner—Curtis Kuntz
Assistant Examiner—Young Tse
Attorney, Agent, or Firm—Foley & Lardner

[57] ABSTRACT

A method and apparatus provide a noise detector generating a logic output indicating presence of noise in an incoming signal and an attenuation controller for providing a stepped-response to noise operatively connected to respond to the logic output to record a count of noise detections. The attenuation controller includes an attenuation interval tracking unit for tracking the elapse of clocking intervals defining a predetermined attenuation interval; the attenuation interval tracking unit receives the noise detection signals and generates a decremental count signal for each clocking interval after the attenuation interval has elapsed, the decremental count signal is conveyed to a noise detection counter which alters the count of noise detections indicated by the logic output in response to the decremental count signal, the attenuation interval tracking unit restores the attenuation interval in response to receiving a noise detection; an attenuation signal generator is responsive to the noise detection count signal to set an attenuation factor according to a predetermined relationship between the count of noise detections and the attenuation factor, the attenuation signal being representative of the attenuation factor; and a logic unit for applying the attenuation signal to the incoming signal to attenuate the incoming signal in stepped fashion according to the attenuation factor.

18 Claims, 4 Drawing Sheets

APPARATUS AND METHOD FOR ATTENUATION A RECEIVED SIGNAL IN RESPONSE TO PRESENCE OF NOISE

CROSS REFERENCE TO RELATED APPLICATIONS

The following applications contain subject matter similar to the subject matter of this application:

U.S. Application Ser. No. 07/887,470, filed May 22, 1992, Attorney Docket Number 204 927, entitled "Apparatus and Method for Discriminating and Suppressing Noise within an Incoming Signal".

U.S. application Ser. No. 07/857,076, filed May 22, 1992, Attorney Docket Number 204 928, entitled "Improved Apparatus and Method for Discriminating and Suppressing Noise within an Incoming Signal".

BACKGROUND OF THE INVENTION

In certain types of communications systems, such as systems employed with wireless telephone systems, information conveyed via analog signalling is received by a receiver in a series of encoded representations of information, generally in the form of a series of "1"'s and "0"'s established via frequency shift keying (FSK) at high frequency. Such transmissions may be subject to reflection such as from buildings and other objects in the transmission path, so there are sometimes radio frequency (RF) signals arriving at a receiver which are time-delayed with respect to other received signals in a manner which may interrupt or distort reception. As a result, the demodulator (or decoder) of the receiver may erroneously convert received signals, thereby becoming unstable and producing interference. Such interference is generally perceived by a user of such a system in the form of popping or clicking sounds or other distracting noises.

It is common in the communications industry to compensate for interference or other noise by providing a feedback circuit with a delay whereby one can estimate the noise component of the received signal, generate a duplicate approximation of the noise component, and subtract that approximate noise component from the original signal to eliminate the noise received in the incoming signal. However, an industry standard published for wireless telephones and similar systems requires that no delays be introduced in such systems; i.e., the system must be what is commonly known as a real-time system. Consequently, a solution for eliminating noise in such a system must likewise be a real-time system.

In addition, sometimes detection of noise is sensitive to certain types of speech patterns and triggers on true speech, mistakenly identifying the true speech as noise. It is important that the information conveyed by the incoming signal be understood by a user despite incorrect triggering by a noise detection system. The present invention, in its preferred embodiment, allows real speech to be transmitted by an audio circuit to a listener at a lower volume level which is subjectively transparent to the listener. The present system increases attenuation of an incoming signal when noise persists, preferably increasing muting quickly and decreasing muting slowly to provide a "fast attack/slow recovery" response to persistent noise.

The present invention provides a real-time noise discriminating and suppressing system designed to quickly discriminate and suppress noise in an incoming signal and which will effect muting in a manner which does not prevent understanding received speech when the invention mistakenly triggers on true speech.

SUMMARY OF THE INVENTION

The present invention includes an apparatus for discriminating and suppressing noise within an incoming signal which comprises a first signal processing unit for processing the incoming signal to generate a first iteration signal which represents average signal level, or signal strength, of the incoming signal; a second signal processing unit for processing the first iteration signal to generate a second iteration signal which is representative of specified aspects of the first iteration signal; a prediction unit for generating a predicted value for the second iteration signal from a plurality of earlier samples of the second iteration signal; a logic unit for determining a difference between the second iteration signal and the predicted value, the logic unit generating a logic output having a first value when the difference exceeds a predetermined threshold value and having a second value when the difference does not exceed the predetermined threshold value; and an attenuation controller for providing a stepped-response to noise in the incoming signal, the attenuation controller being operatively connected to receive the logic output and responding to the logic output to record a count of noise detection when the logic output indicates a presence of noise in the incoming signal.

The attenuation controller includes an attenuation interval tracking unit for tracking the elapse of clocking intervals defining a predetermined attenuation interval; the attenuation interval tracking unit receives the noise detection signals and generates a decremental count signal for each clocking interval after the attenuation interval has elapsed, the decremental count signal being operatively conveyed to a noise detection counter which alters the count of noise detections indicated by the logic output in response to the decremental count signal, the attenuation interval tracking unit restoring at least part of an elapsed portion of the attenuation interval in response to receiving a predetermined number of noise detection signals; an attenuation signal generator is responsive to the noise detection count signal to set an attenuation factor according to a predetermined relationship between the count of noise detections and the attenuation factor, the attenuation signal being representative of the attenuation factor; and a logic unit for applying the attenuation signal to the incoming signal to attenuate the incoming signal in stepped fashion according to the attenuation factor.

A further aspect of the present invention includes a method for discriminating and suppressing noise within an incoming signal which comprises the steps of (1) generating a first iteration signal which is representative of average signal level, or signal strength, of the incoming signal; (2) generating a second iteration signal which is representative of the first iteration signal normalized with respect to a maximum signal level expected of the incoming signal; (3) generating a predicted value for the second iteration signal from a plurality of earlier samples of the second iteration signal; (4) determining a difference between the second iteration signal and the predicted value; (5) generating a control signal which has a first value when the difference exceeds a predetermined threshold value and has a second value when the difference does not exceed the predetermined threshold value; (6) recording a count of noise detections according to the control signal; (7) establishing an attenuation interval and generating a decremental count for each clocking interval after the attenuation interval has elapsed; (8) decrementing the count of noise detections by said decremental count; (9) setting an attenuation factor according to the count of noise detections; (10) generating an attenuation signal representative of the attenuation factor; and (11) providing a muting unit for muting signals which is operatively connected to receive the incoming signal and the attenuation signal and responds to the attenuation signal to mute the incoming signal, according to the attenuation factor.

It is, therefore, an object of the present invention to provide a method and apparatus for discriminating and suppressing noise within an incoming signal which efficiently and accurately identifies and discriminates noise within an incoming signal and mutes that noise in a stepped-response to the noise.

It is a further object of the present invention to provide a method and apparatus for discriminating and suppressing noise within an incoming signal which will allow conveyance of information contained in the incoming signal even if the noise detection is triggered by true speech.

Further objects and features of the present invention will be apparent from the following specification and claims when considered in connection with the accompanying drawings illustrating the preferred embodiment of the invention.

DETAILED DESCRIPTION OF THE DRAWINGS

DETAILED DESCRIPTION OF THE INVENTION

Figure 1:
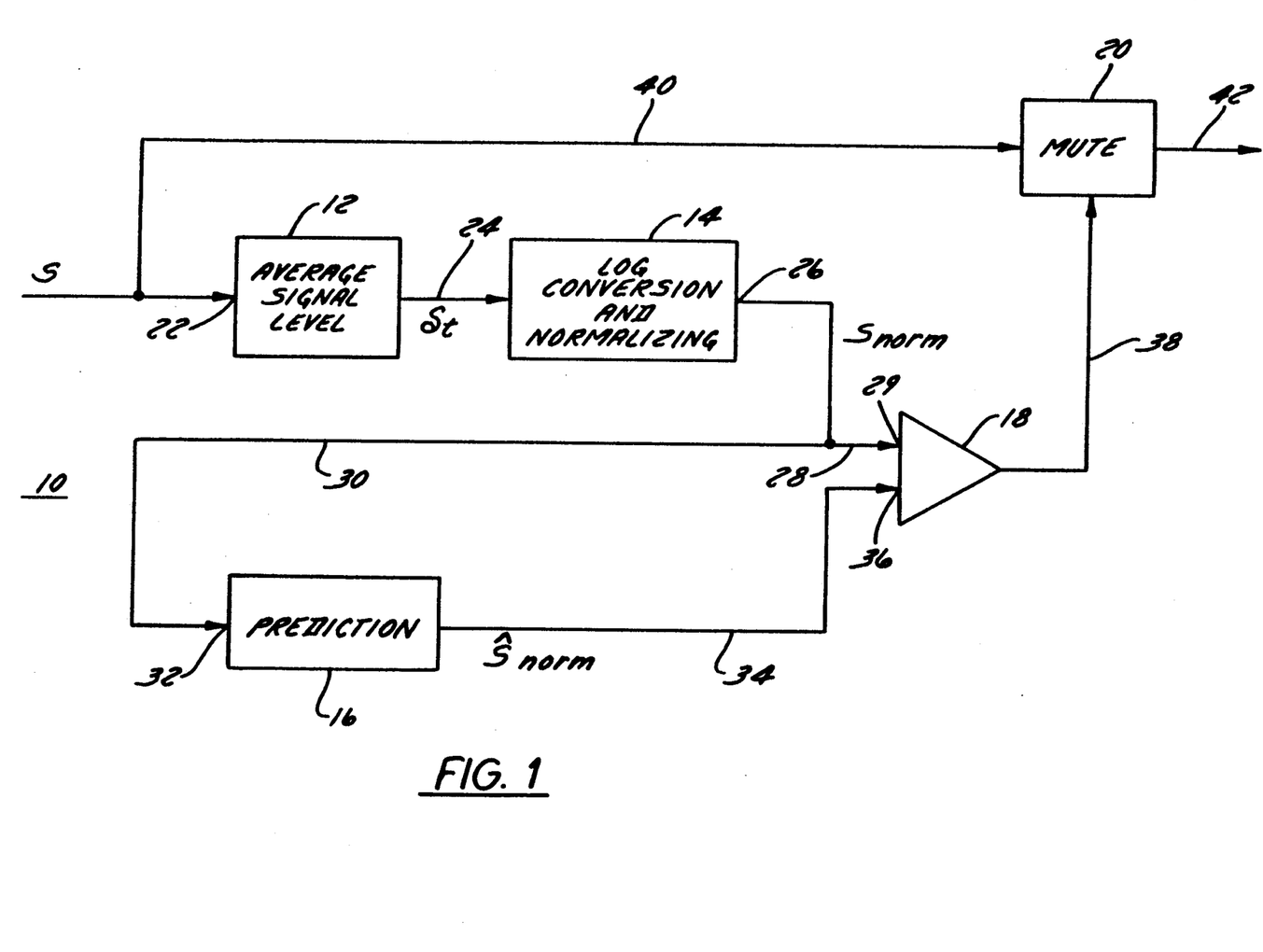
FIG. 1 is a schematic block diagram of the preferred embodiment of the apparatus of the present invention.

FIG. 1 is a schematic block diagram of the preferred embodiment of the apparatus of the present invention. In FIG. 1, an apparatus 10 for discriminating and suppressing noise within an incoming signal is illustrated as including an signal level averaging unit 12, a log conversion and normalizing unit 14, a prediction unit 16, a comparator unit 18, and a muting unit 20.

In the preferred embodiment of the present invention, apparatus 10 is employed in a wireless phone system (i.e., a phone system having no cord connecting the phone receiver and a base unit, the base unit being configured to receive telephone signals by wire or other means). In such wireless telephone systems, the input speech received at an input 22 of signal level averaging unit 12 is already band limited to four KHz prior to reception by the receiving system. This input speech can be received from other sources in other systems, such as recording machines, and may be in linear format or in compressed form having been compressed according to any of several compression algorithms. Speech which is in compressed form [e.g., pulse code modulated (PCM), adaptive differential pulse code modulation (ADPCM), differential pulse code modulation (DCPM), or the like] passes through a normal decoder for the appropriate respective coding system and is then introduced into the audio receiver as linear data. Noise detection preferably occurs after the received signal is decoded. No delay need be introduced into the receiving system if such delay is critical to performance (or if industry standards preclude any delay). However, if a small amount of delay is used, the early part of a noisy passage of signal can be removed which improves performance.

An incoming signal s is received from the output of a signal decoder (not shown in FIG. 1) by signal level averaging unit 12 at input 22. Signal level averaging unit 12 calculates an average signal level $\delta_t$, preferably according to the relationship:

$$\delta_t = \frac{1}{n} \sum_{i=1}^{n} |s_i| \qquad [\text{Eq. 1}]$$

where $\delta_t$ = average signal level, $|S_i|$ = absolute value of the signal level of the $i^{th}$ sample of the incoming signal s, and n = number of samples.

Signal level averaging unit 12 preferably averages the absolute value of incoming signal s over n samples at a sampling rate of 8 KHz.

During normal speech, the output of signal level averaging unit 12 varies slowly so that its output can be predicted accurately. However, when incoming signal s is noisy, large errors occur in the prediction of average signal level $\delta_t$. Such presence of noise in incoming signal s can thus be detected whenever the inverse of prediction error is less than a predetermined threshold level (or, conversely, whenever prediction error is greater than a predetermined threshold level). The choice of threshold level can affect the performance of apparatus 10 because, if the threshold is set too high, apparatus 10 triggers on true speech, and if the threshold is set too low, noise can be missed.

Signal level averaging unit 12 provides its output $\delta_t$ to log conversion and normalizing unit 14 via a line 24. Average signal level $\delta_t$ is provided to log conversion and normalizing unit 14 via a line 24. Incoming signal s is preferably received as a series of "1"'s and "0"'s in the form of a frequency shift keyed (FSK) signal, converted to linear data by a decoder before input to signal level averaging unit 12.

Log conversion and normalizing unit 14 performs a conversion of average signal level $\delta_t$, preferably according to the known relationship:

$$S_{norm} = 10\log_{10}\left(\frac{\delta_t}{\delta_{max}}\right) \qquad [\text{Eq. 2}]$$

where $S_{norm}$ = average signal level normalized with respect to maximum signal level, $\delta_t$ = average signal level, and $\delta_{max}$ = maximum expected signal level.

Thus, log conversion and normalizing unit 14 provides at an output 26 the quantity $S_{norm}$ (expressed in decibels (db)) representing average signal level $\delta_t$ normalized with respect to maximum signal level $\delta_{max}$ expected to be received by apparatus 10. Preferably, $\delta_{max} = 8192$.

The implementations of Equations (1) and (2) are preferably simplified for use in a binary arithmetic system and it is desirable that the division functions be removed for convenience, efficiency, and speed in calculation.

Each incoming signal sample $s_i$ is a 16-bit 2's complement number arranged in a format shown below where the arithmetic mask is 19-bit:

Bit No.  18 17 16 15 14 13 12 11 10  9 8 7 6 5 4 3 2 1 0
         s  15 14 13 12 11 10 9 8 7 6 5 4 3 2 1 where "S" is the sign bit and there are 15 magnitude bits, "bits 15–1".

Equation (1) requires that the "modulus", or absolute value, of the signal level, or signal strength, of each incoming signal sample $s_i$ be generated and added to the previous $(n-1)$ samples of $|S_i|$. The value of n is preferably chosen to be 8 since it represents $2^3$ and is therefore easily handled by a binary number system. Eight samples can be accumulated in an arithmetic logic unit (ALU) in the number format shown above without overflow, and an averaging filter which accommodates $n=8$ has demonstrated good performance in fulfilling the requirements of signal level averaging unit 12.

Thus, when average signal level $\delta_t$ finally accumulated, it resides in an ALU in the following accumulated format:

Bit No.  18 17 16 15 14 13 12 11 10  9 8 7 6 5 4 3 2 1 0
         s  18 17 16 15 14 13 12 11 10 9 8 7 6 5 4 3 2 1

|———————— most significant 16 bits ————————|

Equation (2) may be simplified to express $S_{norm}$ in a base 2 logarithm format for more straightforward treatment using a binary system in the form of Equation (3) as shown below:

$$S_{norm} = 10\log_{10}\frac{\delta_t}{\delta_{max}} = K(\log_2\delta_t - \log_2\delta_{max}), \quad \text{[Eq. 3]}$$

where $K = 10\log_{10}2 = K(\log_2\delta_t - K_1)$, where $K_1 = \log_2\delta_{max}$ $\delta_{max}$ is preferably chosen as $8192=2^{13}$, since in this preferred exemplary system 8192 is the maximum signal level expected in a normal decoder output. Any signal in excess of 8192 is, thus, treated as an overloaded signal (i.e., saturated speech input or noise).

Equation (3) simplifies the operation of apparatus 10, especially since it avoids division. K is a scaling factor, which can be ignored, and $K_i$ is a constant which may be prestored and, therefore, does not require calculation. The most significant 16 bits of the ALU in the accumulated format described above are applied to $\log_2$ hardware (which is available as a known circuit block); the output of the $\log_2$ hardware is an 11-bit plus implied positive sign (12-bit) value stored in a 12-bit format as shown below:

Bit No.  18 17 16 15 14 13 12 11 10 9 8 7 6 5 4 3 2 1 0
          0  X  X  X  X  X  X  X  X X X X 0 0 0 0

|———————— most significant 16 bits ————————|
Output of $\log_2$ Hardware circuit This $\log_2$ value is a signed, 4-bit exponent, 7-bit mantissa parameter where the 4-bit exponent represents the position of the most significant "1" in the 16-bit value $\delta_t$.

The prestored constant $K_1$ may then be subtracted from the output $\delta_t$ of signal level averaging unit 12 by log conversion and normalizing unit 14 to generate normalized average signal level $S_{norm}$.

Normalized average signal level $S_{norm}$ is conveyed via a line 28 to a first input 29 of comparator unit 18, and is conveyed via a line 30 to an input 32 of prediction unit 16.

The predicted value of the normalized average signal level $\hat{S}_{norm}$ is preferably determined according to the relationship:

$$\hat{S}_{norm} = \sum_{i=1}^{m} Y_i S_{norm}^{t-i} \quad \text{[Eq. 4]}$$

where $m=4$ and $Y_i$ are predefined constants. The four past scaled values of $S_{norm}$ are represented by $Y_i S_{norm}^{t-i}$ and are accumulated in prediction unit 16. Equation (4) may be executed employing an $8\times 16$-bit parallel multiplier where the most significant 16-bits of the $S_{norm}$ parameter (in the 12-bit format described above) are applied to the 16-bit input of the multiplier and the T parameters are (prestored as 8-bit signed coefficients) applied to the 8-bit input of the multiplier. The output of the multiplier is preferably in the 12-bit format described above (and in $\log_2$ format).

Prediction unit 16 conveys the value $\hat{S}_{norm}$ via a line 34 to a second input 36 of comparator unit 18. The apparatus by which prediction unit 16 calculates the value $\hat{S}_{norm}$ will be discussed in greater detail hereinafter in connection with FIG. 3.

Comparator unit 18 calculates a prediction error parameter $E_t$, preferably in decibels (db), according to the relationship:

$$E_t = 10\log_{10}\frac{(S_{norm})^2}{(S_{norm} - \hat{S}_{norm})^2} \quad \text{[Eq. 5]}$$

This may be simplified to:

$$E_t = K_2(\log_2 S_{norm} - \log_2[S_{norm} - \hat{S}_{norm}]) \quad \text{[Eq. 6]}$$

Execution of Equation (6) requires only two subtractions and two $\log_2$ functions, thus simplifying execution of Equation (6) by eliminating any division operations. $K_2=20\log_{10}2$, and is a constant which can be ignored in the preferred exemplary implementation.

$E_t$ is compared with a predetermined threshold, for example 8 db, so that if $E_t$ exceeds the predetermined threshold, it is assumed that incoming signal s contains speech information, and if $E_t$ is less than the predetermined threshold, it is assumed that incoming signal s contains noise. Thus, muting unit 20 receives a logic output representing a comparison of $E_t$ with the predetermined threshold via a line 38 from comparator unit 18. Muting unit 20 also receives incoming signal s via a line 40. Muting unit 20 responds to the logic output signal received on line 38 to effect muting on incoming signal s received via line 40 when the logic output signal received via line 38 indicates that incoming signal s contains noise; i.e., when $E_t$ is less than the predetermined threshold. Similarly, muting unit 20 effects no muting of incoming signal s when the logic output signal received via line 38 indicates that incoming signal s contains speech information; i.e., when $E_t$ exceeds the predetermined threshold. Muting unit 20 provides an output signal on a line 42, which output signal is either a muted or non-muted signal, depending upon the value of the logic output signal received by muting unit 20 via line 38 from comparator unit 18.

Thus, apparatus 10 performs a noise discriminating function and a noise suppressing function. When apparatus 10 determines that incoming signal s contains noise, it effects muting of incoming signal s until it is later determined that incoming signal s contains speech information, at which time muting of incoming signal s may be discontinued. Alternatively, muting may be effected for a predetermined muting period (e.g., 256 clock cycles) on each occasion of noise detection, and a recheck for presence of noise may be conducted after each such muting period expires to determine anew whether to impose muting for a succeeding muting period.

Apparatus 10 is based upon a signal level prediction and upon an assumption that during normal speech the average signal level varies relatively slowly but channel noise often causes the decoder (from which incoming signal s is received by apparatus 10) to become unstable resulting in a large increase in decoded signal level in a much shorter time than is experienced when incoming signal s contains speech information. It is this rapid and large increase in level which is perceived as unpleasant clicks or pops by a user.

During normal speech, the relatively slowly-varying signal level of incoming signal s can be predicted relatively accurately. However, when the decoder becomes unstable (as when noise is present) this signal is not predictable and results in a large error in the predictor output. Apparatus 10 detects the onset of a noise burst whenever the prediction error parameter $E_t$ is less than a predetermined threshold. The choice of the threshold directly affects performance and responsiveness of the system, and is generally determined empirically.

Instead of relying upon a predetermined muting period to effect noise reduction, it may be advantageous to detect the termination of a noise burst, a burst end, to determine when to cease muting. To detect a burst end, apparatus 10 may track the slope of a quantizer step size which is calculated simply as the average difference of signal level (or another parameter related to signal level) over some interval. This slope is compared to a threshold and, if the slope is more negative than the threshold, then the end of an error burst is determined to have occurred. Once such a burst end is detected, muting may be terminated or may be continued for a short interval in order to ensure full recovery of the decoder before discontinuing muting. The optimum interval for such extended muting is preferably determined empirically.

Figure 2:
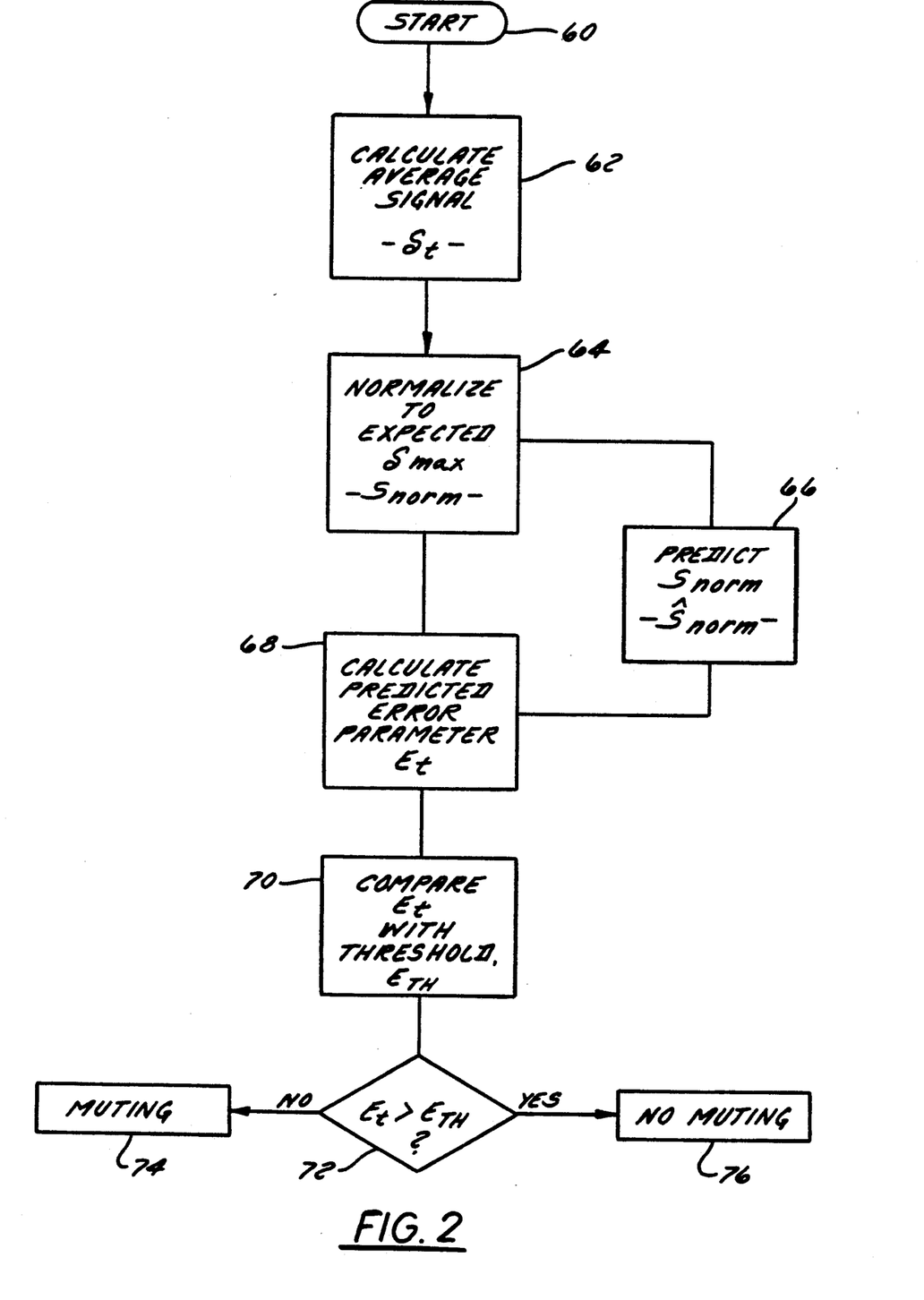
FIG. 2 is a flow diagram illustrating the preferred embodiment of the method of the present invention.

FIG. 2 is a flow diagram illustrating the preferred embodiment of the method of the present invention. In FIG. 2, the method starts at a block 60 with reception of incoming signal s (see FIG. 1), and average signal level $\delta_t$ is calculated (Block 62) as a function of incoming signal level s, preferably according to the relationship:

$$\delta_t = \frac{1}{n} \sum_{i=1}^{n} |s_i| \quad \text{[Eq. 7]}$$

where $\delta_t$ = average signal level, $|S_i|$ = absolute value of the signal level of the $i^{th}$ sample of the incoming signal s, and n = number of samples.

Then there is calculated (Block 64) a normalized average signal level $S_{norm}$, preferably according to the relationship:

$$S_{norm} = 10\log_{10}\left(\frac{\delta_t}{\delta_{max}}\right) \quad \text{[Eq. 8]}$$
$$= K(\log_2 \delta_t - K_1)$$

where $S_{norm}$ = average signal level normalized with respect to maximum signal level, $\delta_t$ = average signal level, $\delta_{max}$ = maximum expected signal level, $K = 10 \log_2 \delta_{max}$.

$K_1 = \log_2 \delta_{max}$.

A predicted value of the normalized average signal level $\hat{S}_{norm}$ is calculated (Block 66), preferably according to the following relationship:

$$\hat{S}_{norm} = \sum_{i=1}^{m} Y_i S_{norm}^{t-i} \quad \text{[Eq. 4]}$$

where $\hat{S}_{norm}$ = predicted average signal level normalized to maximum expected signal level of said incoming signal, $Y_i$ = a scaling factor, $S^{t-i}$ = $i^{th}$ past sample of normalized average signal level, and m = number of samples.

In the preferred embodiment, it has been found sufficient for the needs of a wireless telephone application to employ a value of 4 for the number of samples m, and to employ predetermined constants for the values of scaling factors $Y_i$.

A prediction error parameter $E_t$ is calculated, preferably according to the expression:

$$E_t = 10\log_{10}\frac{S_{norm}^2}{(S_{norm} - \hat{S}_{norm})^2} \quad \text{[Eq. 9]}$$
$$= K_2(\log_2 S_{norm} - \log_2[S_{norm} - \hat{S}_{norm}])$$

where $K_2 = 20 \log_{10} 2$.

$E_t$ is compared with a predetermined threshold value (Block 70) to generate a logic output signal reflecting that comparison; the logic output value has a first value when $E_t$ exceeds the predetermined threshold value, thereby indicating the presence of speech in incoming signal s; and the logic output signal has a second value when $E_t$ is less than the predetermined threshold, thereby indicating the presence of noise in incoming signal s (Block 72). Thus, incoming signal s is muted by a muting device when the logic output signal indicates the presence of noise in incoming signal s (Block 74). When the logic output signal indicates the presence of speech in incoming signal s, the muting device effects no muting of incoming signal s (Block 76).

Figure 3:
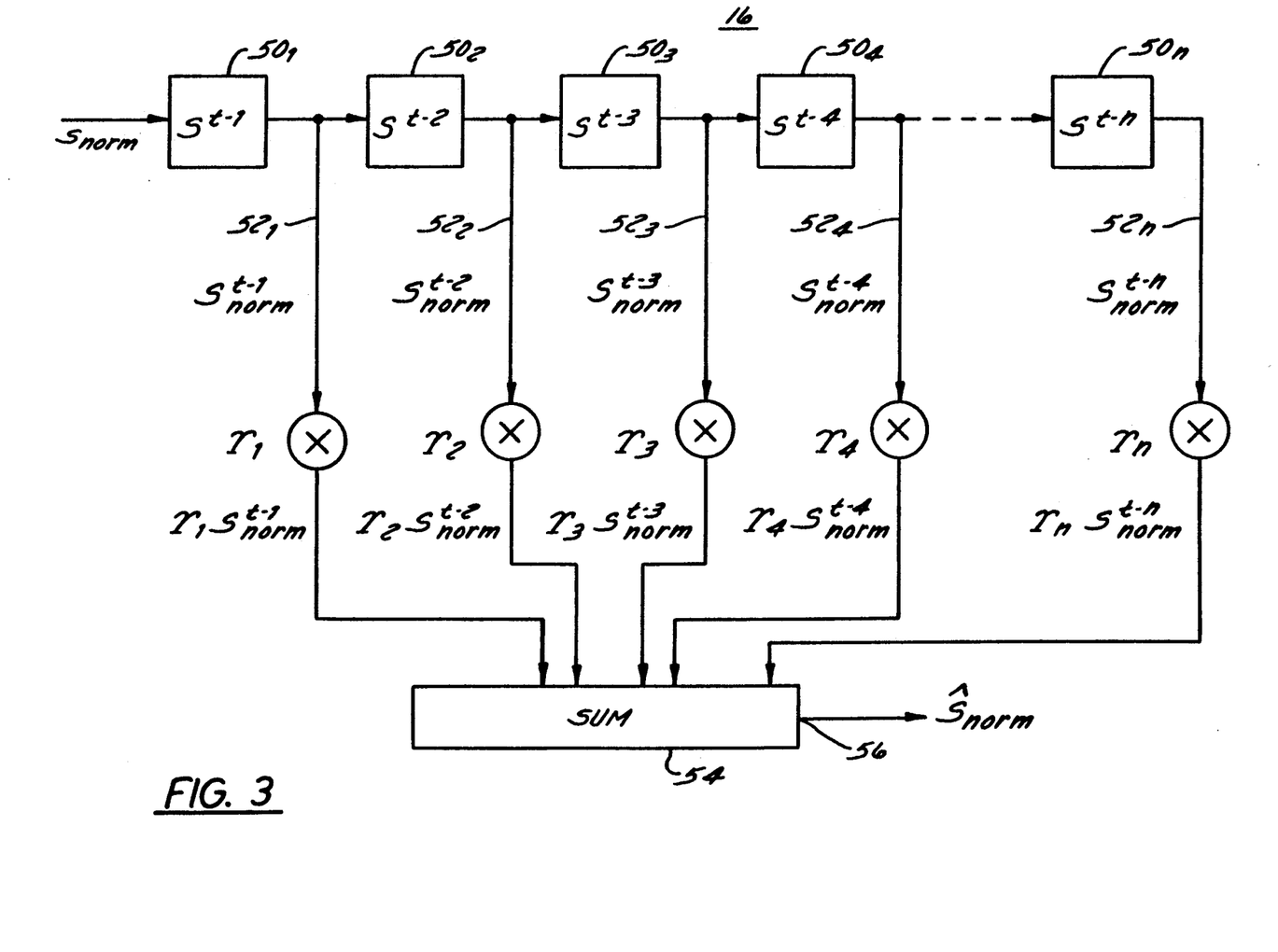
FIG. 3 is a schematic block diagram of the preferred embodiment of the prediction unit of the present invention.

FIG. 3 is a schematic block diagram of the preferred embodiment of the prediction unit of the present invention. In FIG. 3, a prediction unit 16 is illustrated as a multi-stage digital filter comprising a plurality of delay units $50_1, 50_2, 50_3, 50_4, \ldots 50_n$. Each delay unit $50_i$ delays the received signal $S_{norm}$ (normalized average signal level) by an additional time period so that an output line $52_1$ conveys the received signal delayed one time period, $S^{t-1}$; output line $52_2$ conveys the received signal delayed by two time periods, $S^{t-2}$; output line $52_3$ conveys the received signal delayed three time units, $S^{t-3}$; output line $52^{t-4}$; conveys the received signal delayed by four time units, $S^{t-4}$; and output line $52_n$ conveys the received signal delayed by n time units, $S^{t-n}$.

Each of the respective output signals $S^{t-i}$ conveyed by output lines $52_i$ are respectively multiplied by a scaling factor $Y_i$ so that output signal $S^{t-1}$ is multiplied by scaling factor $Y_1$, output signal $S^{t-2}$ is multiplied by scaling factor $Y_2$, output signal $S^{t-3}$ is multiplied by scaling factor $Y_3$, output signal $S^{t-4}$ is multiplied by scaling factor $Y_4$, and output signal $S^{t-n}$, is multiplied by scaling factor $Y_a$. The resultant scaled output signals $Y_i S^{t-i}$ are summed in a summer 54 which provides at an output 56 a predicted value $\hat{S}_{norm}$ for normalized average signal level $\hat{S}_{norm}$ based upon a plurality of earlier samples $S^{t-i}$ of $S_{norm}$.

Apparatus 10 may be designed to implement a "fast attack/slow recovery" muting scheme which effectively suppresses noise while mitigating the effect of falsely detecting true speech as noise. Such a stepped muting scheme is preferably based on the fact that the noise signals usually cause a detector to trigger many times during the period of a noisy signal but only cause a detector to trigger once (or twice, dependent upon the setting of $E_{TH}$) during true speech.

Figure 4:
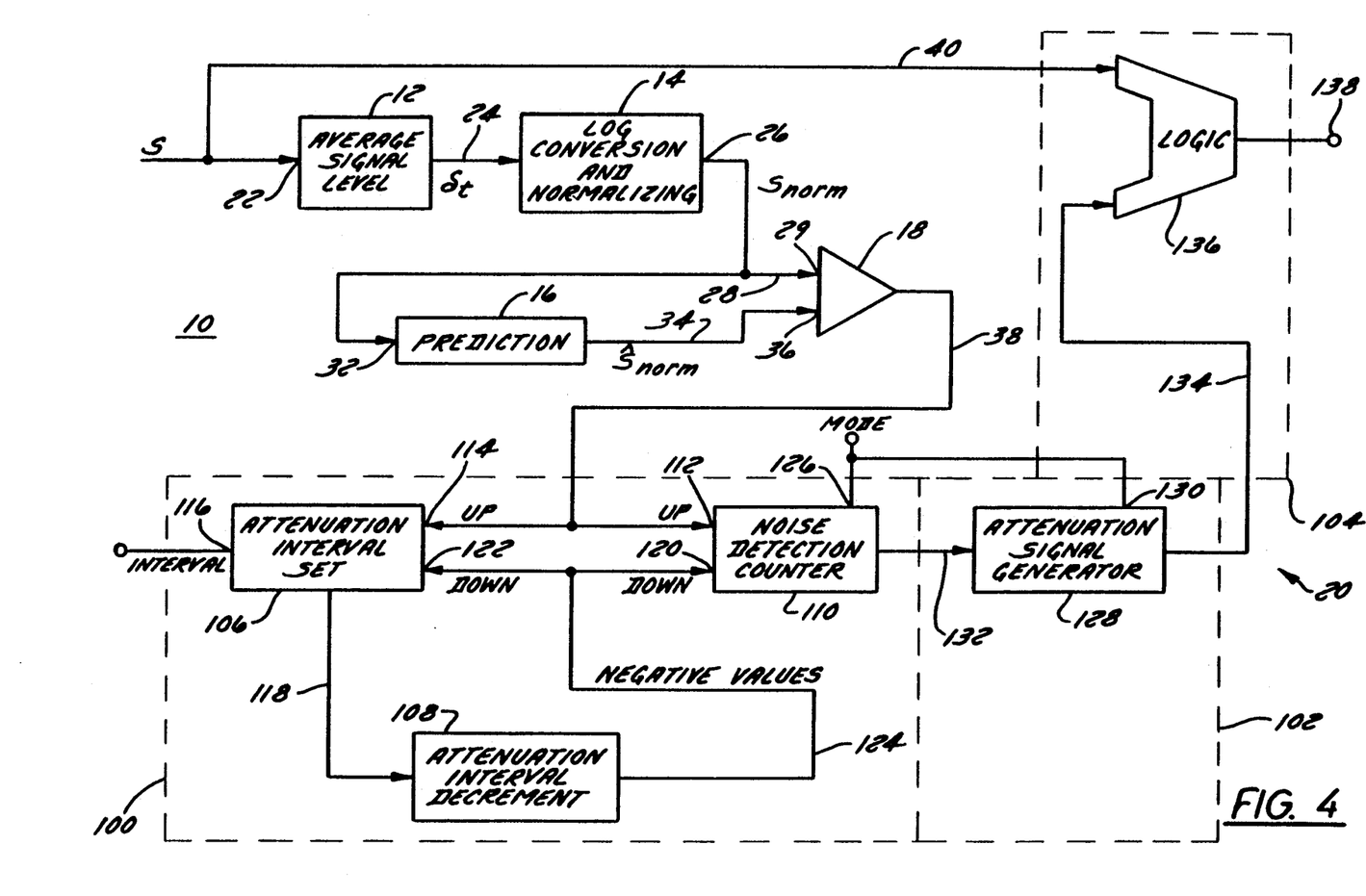
FIG. 4 is a schematic block diagram of the present invention showing details of the attenuation control unit.

FIG. 4 is a schematic block diagram of the present invention showing details of the attenuation control unit.

To facilitate ease of understanding the description of the present invention, like elements will be identified by like reference numerals in the various drawings.

In FIG. 4, details of muting unit 20 are illustrated as including an interval tracking section 100, a signal generation section 102, and an attenuation section 104.

Interval tracking section 100 includes an attenuation interval setting unit 106, an attenuation interval decrementing counter 108, and a noise detection counter 110. The output logic signal conveyed via line 38 from comparator unit 18 is received at an up-count input 112 to noise detection counter 110 as well as at an up-count input 114 to attenuation interval setting unit 106. A predetermined attenuation interval is preferably established as a given number of clock intervals in attenuation interval setting unit 106 via an interval input 116, and the predetermined attenuation interval is conveyed via a line 118 to attenuation interval decrementing counter 108. Attenuation interval decrementing counter 108 decrements the predetermined attenuation interval by one clock count for each clock period until the predetermined attenuation interval is fully decremented. Upon fully decrementing the predetermined attenuation interval, attenuation interval decrement counter 108 commences outputting decrementing counting inputs to a down-count input 120 to noise detection counter 110 and to a down-count input 122 to attenuation interval setting unit 106 via a line 124. An attenuation mode setting is input to noise detection counter 110 via an input 126 and is input to an attenuation signal generator 128 (contained within signal generation section 102) via an input 130. Noise detection counter 110 provides an output to attenuation signal generator 128 via a line 132. Attenuation signal generator 128 generates an attenuation signal for output via a line 134 to a logic unit 136 in attenuation section 104. Logic unit 136 receives incoming signal s via a line 40 and applies the attenuation signal received via line 134 to incoming signal s in a manner to be described in greater detail hereinafter to generate an output at terminal 138.

When noise suppression is disabled, or when the logic output signal on line 38 indicates no noise is detected, noise detection counter 110, which preferably is a 2-bit noise detection counter, is held at 00 binary. This causes attenuation signal generator 128 to pass an attenuation signal to logic unit 136 via line 134 which is decoded by logic unit 136 as a "zero shift", resulting in no attenuation of incoming signal s.

When noise suppression is enabled and the logic output signal on line 38 indicates a detection of noise, a mute-length, or predetermined attenuation interval, representing the number of samples, or clock intervals, for which incoming signal s is to be attenuated, is loaded into attenuation interval setting unit 106 via interval input 116. The attenuation interval is decremented one count each clock period by attenuation interval decrementing counter 108. When attenuation interval decrementing counter 108 counts past zero and goes negative, a decrement input is provided to down-count input 120 of noise detection counter 110 and noise detection counter 110 counts down. If noise detection counter 110 is zero (00) it cannot decrement any further and will remain at count "00".

For this preferred exemplary embodiment, four mute modes are used as described below in Table I.

| Mute Mode | | ← No Muting | Stepped Muting → | | | |
|---|---|---|---|---|---|---|
| Binary | Decimal | | Attenuation Factors | | | |
| 00 | (0) | x1 | | | | x1/128 |
| 01 | (1) | x1 | x½ | | | x1/128 |
| 10 | (2) | x1 | x½ | x¼ | | x1/128 |
| 11 | (3) | x1 | x½ | x¼ | x⅛ | x1/128 |

——→ Mute Direction

Thus, in mute mode "00", if noise is detected once, noise detection counter 110 increments to "1" and attenuation signal generator 128 passes an attenuation signal via line 134 to logic unit 136 indicating an attenuation factor of 1/128, i.e., output=input/128.

In mute mode "11", for example, if noise is detected once, noise detection counter 110 increments to 1 and attenuation signal generator 128 passes an attenuation signal via line 134 to logic unit 136 indicating an attenuation factor of ½ so the output of logic unit 136 is incoming signal s attenuated by 50%.

If the predetermined attenuation interval were, for example, set to 32 samples, attenuation interval decrementing counter 108 would decrement one count for each sample period until the decremented attenuation interval goes negative. If no further noise detections occur during that 32-sample period, then noise detection counter 110 will have decremented to "0" and attenuation signal generator 128 will output an attenuation signal, or shift code, representing no attenuation.

However, if during the 32-sample attenuation interval, another noise detection occurs, attenuation interval setting unit 106 will receive an input at its up-count input 114 so that attenuation interval setting unit 106 will be reset to a 32 count and noise detection counter 110 will increment to "2". Thus, in mode "11", for example, attenuation signal generator 128 will output an attenuation signal indicating an attenuation factor of ¼ so that incoming signal s will be attenuated by 75%. If no noise is detected for a 32-count period, noise detection counter 110 will decrement to "1" so that (continuing in mode "11") attenuation factor ½ will be indicated by attenuation signal generator 128. Another 32-count period without noise will cause noise detection counter 110 to decrement to "0" and no attenuation will occur.

In such manner a "fast attack/slow recovery" response is effected as soon as noise is detected: attenuation interval setting unit 106 is reset to the predetermined attenuation interval via its up-count input 114, and noise detection counter 110 is immediately incremented via its up-count input 112. Since noise triggers apparatus 10 many times (once a noise signal is present), apparatus 10 reacts quickly to attenuate input signal s by an attenuation factor of 1/128, which is high attenuation. If no noise is detected, attenuation interval decrementing counter 108 allows the attenuation factor to be changed after each 32-sample period by only one level.

For example, if mute mode "11" is programmed and the attenuation interval, or mute length, is set at 32, if the attenuation factor reaches 1/128 before noise disappears, then the recovery time to zero attenuation will be 4×32=128 samples. In contrast, if noise is detected four times in the first 10 samples of a noisy incoming signal s, the attenuation factor will reach 1/128 in 10 samples.

As previously mentioned, apparatus 10 may be sensitive to triggering on speech which is mistakenly detected as noise, especially if threshold $E_{TH}$ is set high. The stepped muting provided by apparatus 10 compensates for such false triggering using the fact that if speech triggers the detector, it only triggers once and not multiple times. Thus, if the mute mode is set to anything other than "00", a true speech incoming signal s will only be attenuated by 50%, an amount which is not detectable by the human ear, and incoming signal s will then recover to zero attenuation after the predetermined attenuation interval is full decremented by attenuation interval decrementing counter 108.

The preferred embodiment of the present invention described herein may miss low-level noise bursts, but subjective tests have shown that such bursts are not subjectively annoying to a listener. Experiments have shown that the apparatus reliably detects and suppresses annoying bursts of noise. The method and apparatus of the present invention use simple arithmetic, multiplication, and log functions, and avoid the use of division, which is expensive to implement (especially in fixed-point arithmetic hardware).

The method and apparatus of the present invention use a simple measurement of signal strength to discriminate between noise and speech and exploit the fact that noise increases in amplitude at a greater rate than normal speech. On the few occasions when speech may be mistaken for noise, the stepped muting scheme of the invention mitigates any disagreeable effect on the listener, rendering such mistaken triggering indistinguishable to the ear.

It is to be understood that, while the detailed drawing and specific examples given describe preferred embodiments of the invention, they are for the purpose of illustration, that the apparatus of the invention is not limited to the precise details and conditions disclosed and that various changes may be made therein without departing from the spirit of the invention which is defined by the following claims.

We claim:

1. An apparatus for attenuating a received signal in response to a presence of noise in said received signal; said presence of noise being indicated by noise detection signals; the apparatus comprising:

a noise detection counter means for maintaining a count of noise detections, said noise detection counter means receiving said noise detection signals and generating a noise detection count signal representing said count of noise detections;

an attenuation interval tracking means for tracking the elapse of clocking intervals, a plurality of said clocking intervals comprising a predetermined attenuation interval, said attenuation interval tracking means receiving said noise detection signals and generating a decremental count signal for each said clocking interval after said attenuation interval has elapsed, said decremental count signal being operatively conveyed to said noise detection counter means, said noise detection counter means altering said count of noise detections in response to said decremental count signal, said attenuation interval tracking means restoring at least part of an elapsed portion of said attenuation interval in response to receiving a predetermined number of said noise detection signals;

an attenuation signal generating means for generating an attenuation signal, said attenuation signal generating means being responsive to said noise detection count signal to set an attenuation factor according to a predetermined relationship between said count of noise detections and said attenuation factor, said attenuation signal being representative of said attenuation factor; and a logic means for applying said attenuation signal to said received signal to effect said attenuation.

2. An apparatus for attenuating a received signal in response to a presence of noise in said received signal as recited in claim 1 wherein said attenuation interval tracking means comprises an attenuation interval register means for establishing said attenuation interval in response to said noise detection signals; and a decremental counter, said counter decrementally counting down said attenuation interval and providing said decremental count to said noise detection counter means.

3. An apparatus for attenuating a received signal in response to a presence of noise in said received signal as recited in claim 1 wherein said predetermined relationship between said count of noise detections and said attenuation factor comprises a plurality of mode settings, said setting of said attenuation factor according to said count of noise detections being determined by which respective mode setting of said plurality of mode settings is selected.

4. An apparatus for attenuating a received signal in response to a presence of noise in said received signal as recited in claim 2 wherein said predetermined relationship between said count of noise detections and said attenuation factor comprises a plurality of mode settings, said setting of said attenuation factor according to said count of noise detections being determined by which respective mode setting of said plurality of mode settings is selected.

5. An apparatus for attenuating a received signal in response to a presence of noise in said received signal; said presence of noise being indicated by noise detection signals; the apparatus comprising:

a noise detection tracking means for tracking a count of noise detections, said noise detection tracking means establishing an attenuation interval as a predetermined number of sampling intervals, said noise detection tracking means receiving said noise detection signals and generating a noise detection count signal representing a count of noise detections occurring during said attenuation interval less the number of said sampling intervals following said attenuation interval during which no noise detections occur;

an attenuation signal generator means for generating an attenuation signal, said attenuation signal generating means being responsive to said noise detection count signal to set an attenuation factor according to a predetermined relationship between said count of noise detections and said attenuation factor, said attenuation signal being representative of said attenuation factor; and a logic means for applying said attenuation signal to said received signal to effect said attenuation.

6. An apparatus for attenuating a received signal in response to a presence of noise in said received signal as recited in claim 5 wherein said noise detection tracking means comprises an attenuation interval register means for establishing said attenuation interval in response to said noise detection signals and a decremental counter for decrementally counting down said attenuation interval, said noise detection tracking means restoring at least part of an elapsed portion of said attenuation interval in response to receiving a predetermined number of said noise detection 7. An apparatus for attenuating a received signal in response to a presence of noise in said received signal as recited in claim 6 wherein said noise detection tracking means further comprises a noise detection counter means, said noise detection counter means receiving a decremental count signal from said decremental counter, said decremental count signal indicating said sampling intervals following said attenuation interval, said noise detection counter means receiving said noise detection signals and generating said noise detection count signal.

8. An apparatus for attenuating a received signal in response to a presence of noise in said received signal as recited in claim 7 wherein said predetermined relationship between said count of noise detections and said attenuation factor comprises a plurality of mode settings, said setting of said attenuation factor according to said count of noise detections being determined by which respective mode setting of said plurality of mode settings is selected.

9. A method for attenuating a received signal in response to a presence of noise in said received signal; said presence of noise being indicated by a noise detection signal; the method comprising the steps of:

(1) sampling said received signal during a plurality of succeeding clocking intervals;

(2) generating said noise detection signal during each of said clocking intervals when noise is detected in said received signal;

(3) maintaining a count of said noise detection signals;

(4) establishing a predetermined attenuation interval, said predetermined attenuation interval comprising a plurality of said clocking intervals, said attenuation interval comencing during a respective clocking interval during which a respective noise detection signal is generated;

(5) generating a decremental count for each said clocking interval after said attenuation interval has elapsed;

(6) decrementing said count of noise detections by said decremental count;

(7) establishing at least one attenuation range, said at least one attenuation range being represented by a plurality of attenuation factors, each respective attenuation factor of said plurality of attenuation factors being associated with a predetermined number of said count of noise detections;

(8) generating an attenuation signal in response to said count of noise detections, said attenuation signal being representative of said attenuation factor;

(9) providing a muting unit for muting signals; said muting unit being operatively connected to receive said received signal and said attenuation signal; said muting unit being responsive to said attenuation signal to mute said received signal according to said attenuation factor.

10. A method for attenuating a received signal in response to a presence of noise in said received signal as recited in claim 9 wherein said at least one attenuation range comprises a plurality of attenuation ranges.

11. An apparatus for attenuating a received signal in response to a presence of noise in said received signal; said presence of noise being indicated by noise detection signals; the apparatus comprising:

a noise detection counter means for maintaining a count of noise detections, said noise detection counter means receiving said noise detection signals and generating a noise detection count signal representing said count of noise detections;

an attenuation interval tracking means for tracking the elapse of clocking intervals, a plurality of said clocking intervals comprising a predetermined attenuation interval, said attenuation interval tracking means receiving said noise detection signals and generating a decremental count signal for each said clocking interval after said attenuation interval has elapsed, said decremental count signal being operatively conveyed to said noise detection counter means, said noise detection counter means altering said count of noise detections in response to said decremental count signal, said attenuation interval tracking means restoring at least part of an elapsed portion of said attenuation interval in response to receiving a predetermined number of said noise detection signals;

an attenuation signal generating means for generating an attenuation signal, said attenuation signal generating means being operatively connected with said noise detection counter means and being responsive to said noise detection count signal to set an attenuation factor according to a predetermined relationship between said count of noise detections and said attenuation factor, said attenuation signal being representative of said attenuation factor; and a logic means operatively connected with said attenuation signal generating means and operatively connected to receive said received signal for applying said attenuation signal to said received signal to effect said attenuation.

12. An apparatus for attenuating a received signal in response to a presence of noise in said received signal as recited in claim 11 wherein said attenuation interval tracking means comprises an attenuation interval register means for establishing said attenuation interval in response to said noise detection signals; and a decremental counter, said counter decrementally counting down said attenuation interval and providing said decremental count to said noise detection counter means.

13. An apparatus for attenuating a received signal in response to a presence of noise in said received signal as recited in claim 12 wherein said predetermined relationship between said count of noise detections and said attenuation factor comprises a plurality of mode settings, said settings of said attenuation factor according to said count of noise detections being determined by which respective mode setting of said plurality of mode settings is selected.

14. An apparatus for attenuating a received signal in response to a presence of noise in said received signal as recited in claim 11 wherein said predetermined relationship between said count of noise detections and said attenuation factor comprises a plurality of mode settings, said setting of said attenuation factor according to said count of noise detections being determined by which respective mode setting of said plurality of mode settings is selected.

15. An apparatus for attenuating a received signal in response to a presence of noise in said received signal; said presence of noise being indicated by noise detection signals; the apparatus comprising:

a noise detection tracking means for tracking a count of noise detections, said noise detection tracking means establishing an attenuation interval as a predetermined number of sampling intervals, said noise detection tracking means receiving said noise detection signals and generating a noise detection count signal representing a count of noise detections occurring during said attenuation interval less the number of said sampling intervals following said attenuation interval during which no noise detections occur;

an attenuation signal generator means for generating an attenuation signal, said attenuation signal generating means being operatively connected with said noise detection tracking means and being responsive to said noise detection count signal to set an attenuation factor according to a predetermined relationship between said count of noise detections and said attenuation factor, said attenuation signal being representative of said attenuation factor; and a logic means operatively connected with said attenuation signal generation means and operatively connected to receive said received signal for applying said attenuation signal to said received signal to effect said attenuation.

16. An apparatus for attenuating a received signal in response to a presence of noise in said received signal as recited in claim 15 wherein said noise detection tracking means comprises an attenuation interval register means for establishing said attenuation interval in response to said noise detection signals and a decremental counter for decrementally counting down said attenuation interval, said noise detection tracking means restoring at least part of an elapsed portion of said attenuation interval in response to receiving a predetermined number of said noise detection signals.

17. An apparatus for attenuating a received signal in response to a presence of noise in said received signal as recited in claim 16 wherein said noise detection tracking means further comprises a noise detection counter means, said noise detection counter means receiving a decremental count signal from said decremental counter, said decremental count signal indicating said sampling intervals following said attenuation interval, said noise detection counter means receiving said noise detection signals and generating said noise detection count signal.

18. An apparatus for attenuating a received signal in response to a presence of noise in said received signal as recited in claim 17 wherein said predetermined relationship between said count of noise detections and said attenuation factor comprises a plurality of mode settings, said setting of said attenuation factor according to said count of noise detections being determined by which respective mode setting of said plurality of mode settings is selected.

* * * * *